(12) United States Patent
Montalvo

(10) Patent No.: US 11,569,797 B2
(45) Date of Patent: Jan. 31, 2023

(54) TRANSCONDUCTOR CIRCUITS WITH PROGRAMMABLE TRADEOFF BETWEEN BANDWIDTH AND FLICKER NOISE

(71) Applicant: Analog Devices, Inc., Norwood, MA (US)

(72) Inventor: Antonio Montalvo, Raleigh, NC (US)

(73) Assignee: ANALOG DEVICES INC, Wilmington, DE (US)

( * ) Notice: Subject to any disclaimer, the term of this patent is extended or adjusted under 35 U.S.C. 154(b) by 207 days.

(21) Appl. No.: 16/910,994

(22) Filed: Jun. 24, 2020

(65) Prior Publication Data

US 2021/0409002 A1 Dec. 30, 2021

(51) Int. Cl.
  *H03F 3/72* (2006.01)
  *H03H 11/04* (2006.01)
  *H03F 3/21* (2006.01)
  *H03F 1/02* (2006.01)

(52) U.S. Cl.
  CPC ......... *H03H 11/0472* (2013.01); *H03F 3/211* (2013.01); *H03F 1/0277* (2013.01); *H03F 3/72* (2013.01)

(58) Field of Classification Search
  CPC ....... H03H 11/0472; H03F 3/211; H03F 1/26; H03F 1/42; H03F 3/72; H03F 2200/36; H03F 2200/372; H03F 2200/451; H03F 2203/21178; H03F 2203/7215; H03F 2203/7236; H03F 3/195; H03F 2203/7209; H03F 3/193; H03F 3/68; H03F 3/45206; H03F 1/223; H03F 2203/45646;
  (Continued)

(56) References Cited

U.S. PATENT DOCUMENTS

| | | |
|---|---|---|
| 7,088,981 B2 | 8/2006 | Chang |
| 7,477,888 B2 | 1/2009 | Behzad |
| 7,493,141 B2 | 2/2009 | Brobston et al. |

(Continued)

OTHER PUBLICATIONS

Dreiecke untersuchen, Mathematik 6, 1 page (DE only, no translation).

(Continued)

*Primary Examiner* — Hafizur Rahman
*Assistant Examiner* — Khiem D Nguyen
(74) *Attorney, Agent, or Firm* — Akona IP PC

(57) ABSTRACT

Transconductor circuits with programmable tradeoff between bandwidth and flicker noise are disclosed. An example circuit includes an input port, an output port, a plurality of transistors, and a switch arrangement that includes a plurality of switches, configured to change coupling between the input port, the output port, and the transistors to place the transconductor circuit in a first or a second mode of operation. An input capacitance of the transconductor circuit operating in the first mode is larger than when the transconductor circuit is operating in the second mode. In the first mode, having a larger input capacitance results in a decreased flicker noise because the amount of flicker noise is inversely proportional to the input capacitance. In the second mode, having a smaller input capacitance leads to an increased flicker noise but that is acceptable for wide-bandwidth applications because wide-bandwidth signals may be less sensitive to flicker noise.

20 Claims, 10 Drawing Sheets

(58) Field of Classification Search
CPC ...... H03D 7/1441; H03D 7/1491; H04B 1/04; H04B 2001/0491
USPC .......................................... 330/51, 303, 133
See application file for complete search history.

(56) References Cited

U.S. PATENT DOCUMENTS

| | | | |
|---|---|---|---|
| 8,060,035 B2 | 11/2011 | Haykin | |
| 8,588,726 B2* | 11/2013 | Connell | ............... H03D 7/1491 327/113 |
| 2007/0243832 A1 | 10/2007 | Park et al. | |
| 2010/0289579 A1* | 11/2010 | Cassia | ....................... H03F 3/19 330/251 |

OTHER PUBLICATIONS

Weldon et al., *A 1.75-GHz Highly Integrated Narrow-Band CMOS Transmitter With Harmonic-Rejection Mixers*, IEEE Journal of Solid-State Circuits, vol. 36, No. 12, Dec. 2001, 13 pages.
*Transconductance*, Wikipedia, https://en.wikipedia.org/wiki/Transconductance, Apr. 23, 2020, 5 pages.
European Search Report issued in EP21180746.6 dated Nov. 18, 2021, 10 pages.
Fu et al., *A 2.4-5.4-GHz Wide Tuning-Range CMOS Reconfigurable Low-Noise Amplifier*, IEEE Transactions on Microwave Theory and Technology, vol. 56, No. 12, Dec. 2008, 10 pages.
Chen et al., *Reconfigurable Receiver with Radio-Frequency Current-Mode Complex Signal Processing Supporting Carrier Aggregation*, IEEE Journal of Solid-State Circuits, vol. 50, Issue 12, Dec. 2015, 15 pages.

\* cited by examiner

US 11,569,797 B2

1

TRANSCONDUCTOR CIRCUITS WITH PROGRAMMABLE TRADEOFF BETWEEN BANDWIDTH AND FLICKER NOISE

TECHNICAL FIELD OF THE DISCLOSURE

The present disclosure generally relates to electronic devices and systems and, more particularly, to transconductor circuits with programmable tradeoff between bandwidth and flicker noise, and to systems that include one or more of such circuits.

BACKGROUND

A transconductor (also referred to as a "transconductance amplifier") is a circuit that performs voltage-to-current conversion. A transconductor is a versatile building block employed in many analog and mixed-signal circuit applications, such as radio frequency (RF) upconverters, gain stages, variable gain-amplifiers, continuous-time filters, delta-sigma modulators, or data converters.

Since transconductors are implemented with active devices (e.g., oftentimes a metal-oxide-semiconductor field-effect transistor (MOSFET) common-source stage), the signal being processed may be corrupted by flicker noise. Flicker noise is inversely proportional to frequency of the signal being processed, and narrow-bandwidth signals are more susceptible to flicker noise than wide-bandwidth signals.

Flicker noise may be reduced by using large-area devices (e.g., by using large-area MOSFETs). With large area comes high capacitance, since MOSFET capacitance is proportional to the device area (namely, proportional to a product of a width and a length of a transistor channel). Nevertheless, such a solution is typically acceptable for semiconductor products intended for narrow-bandwidth applications.

It is often desirable to be able to use a single semiconductor product both in narrow-bandwidth and wide-bandwidth applications. For example, in the case of software-defined radio products, there may be narrow-bandwidth and wide-bandwidth applications. Unfortunately, a semiconductor product with one or more transconductors in which flicker noise has been reduced by using large-area devices may not be suitable for wide-bandwidth applications because the resulting high capacitance may make it impossible to tune to wide-bandwidth signals.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

2

Figure 3:
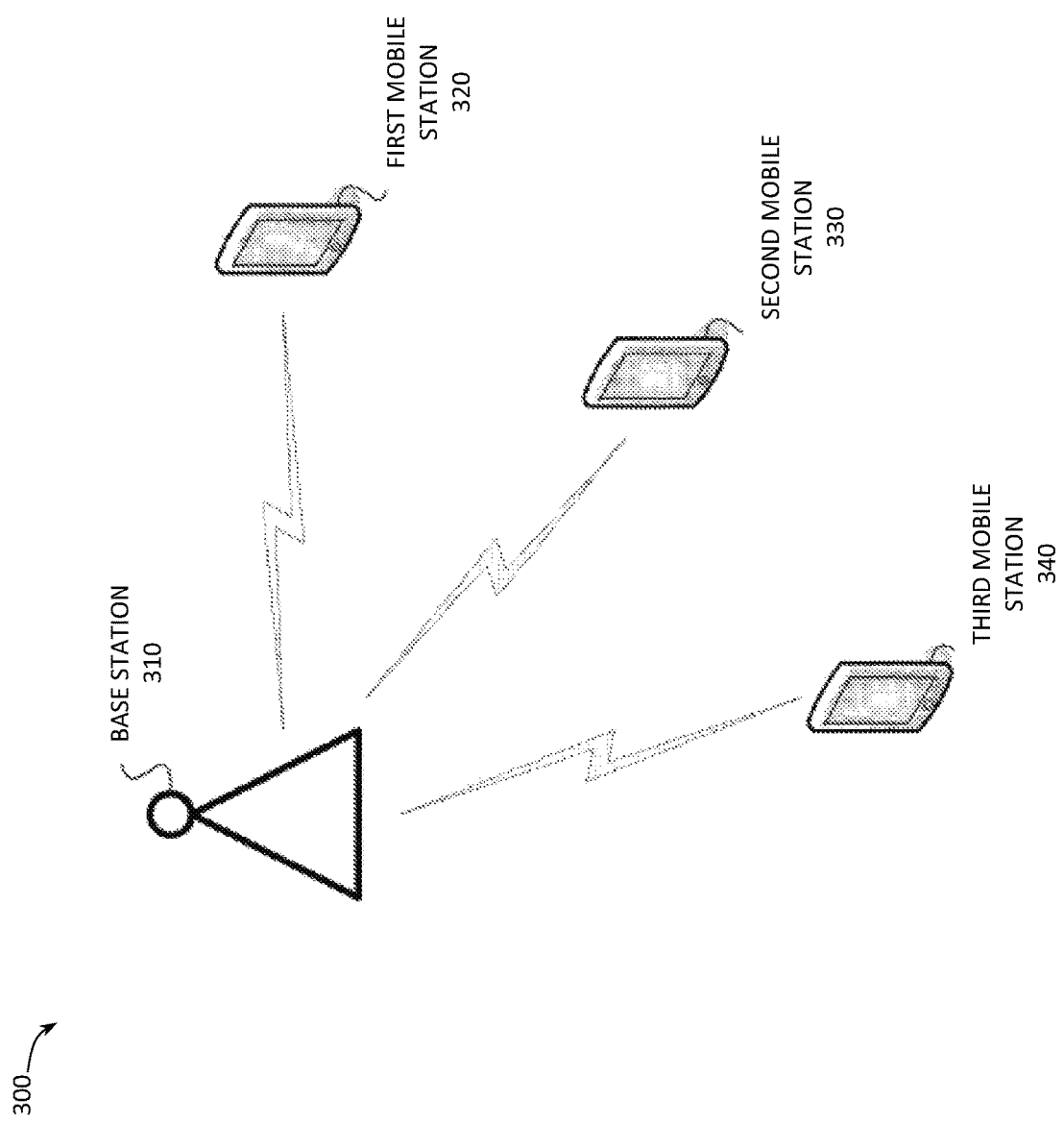
Figure 4:
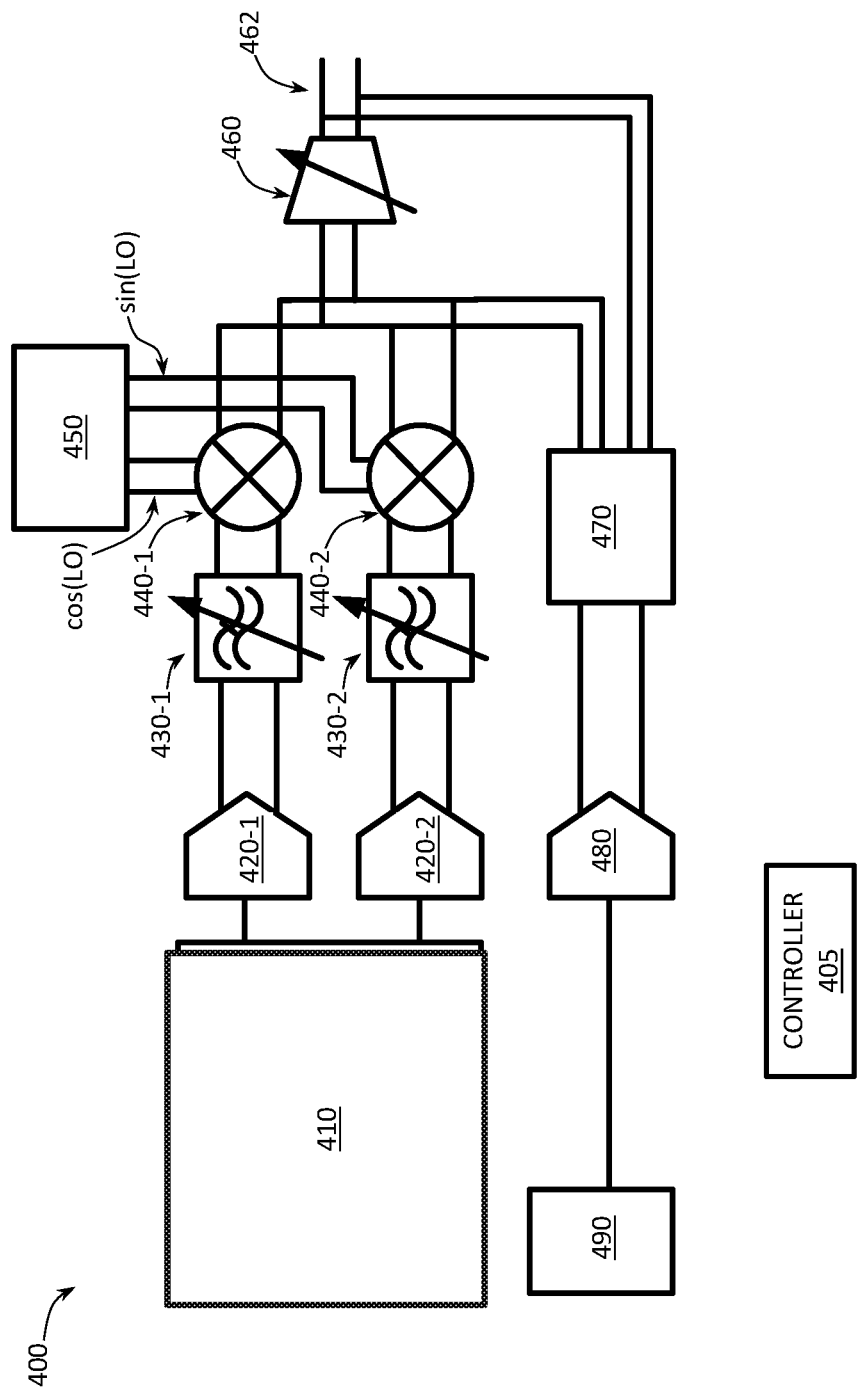
Figure 5A:
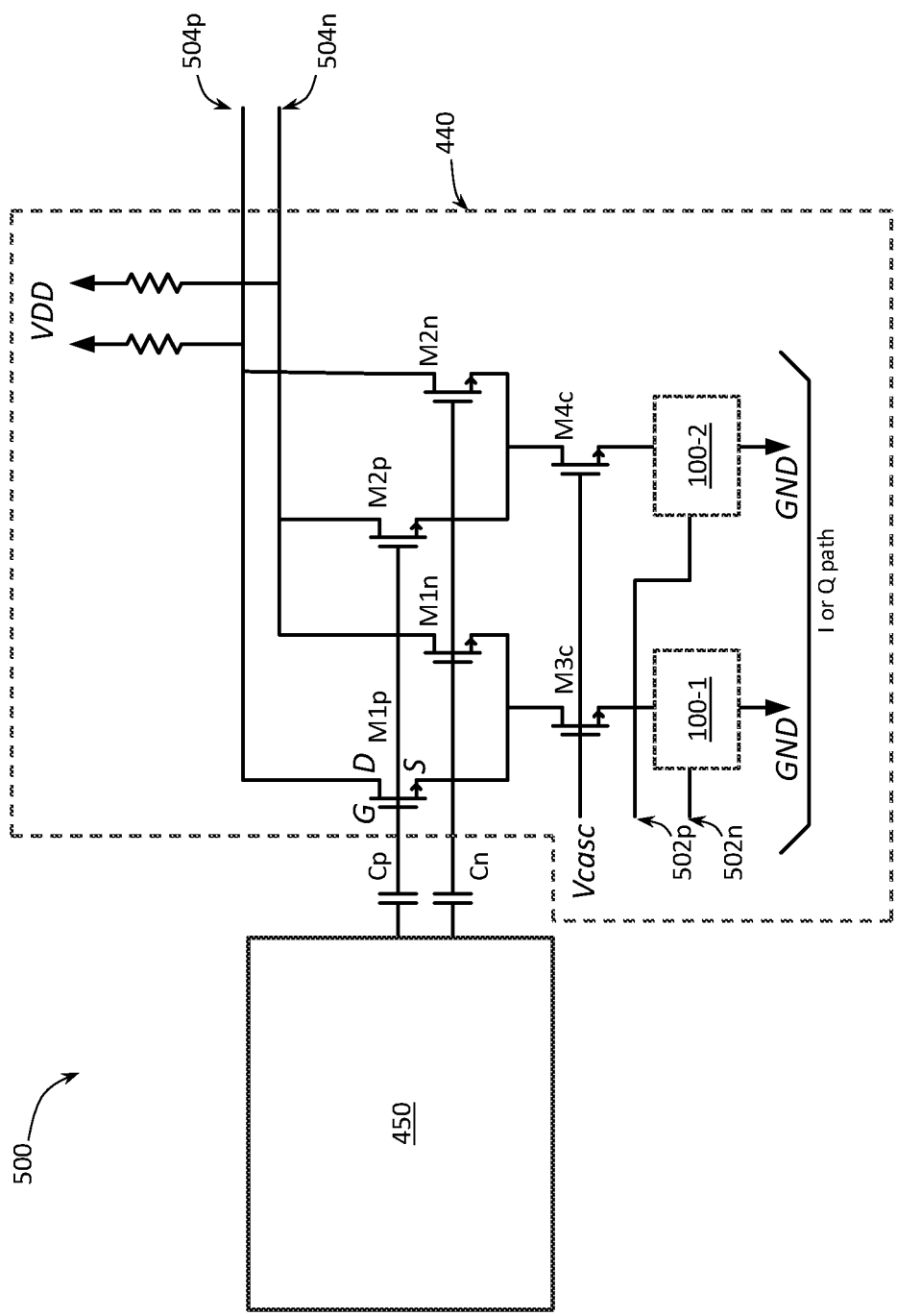
Figure 5B:
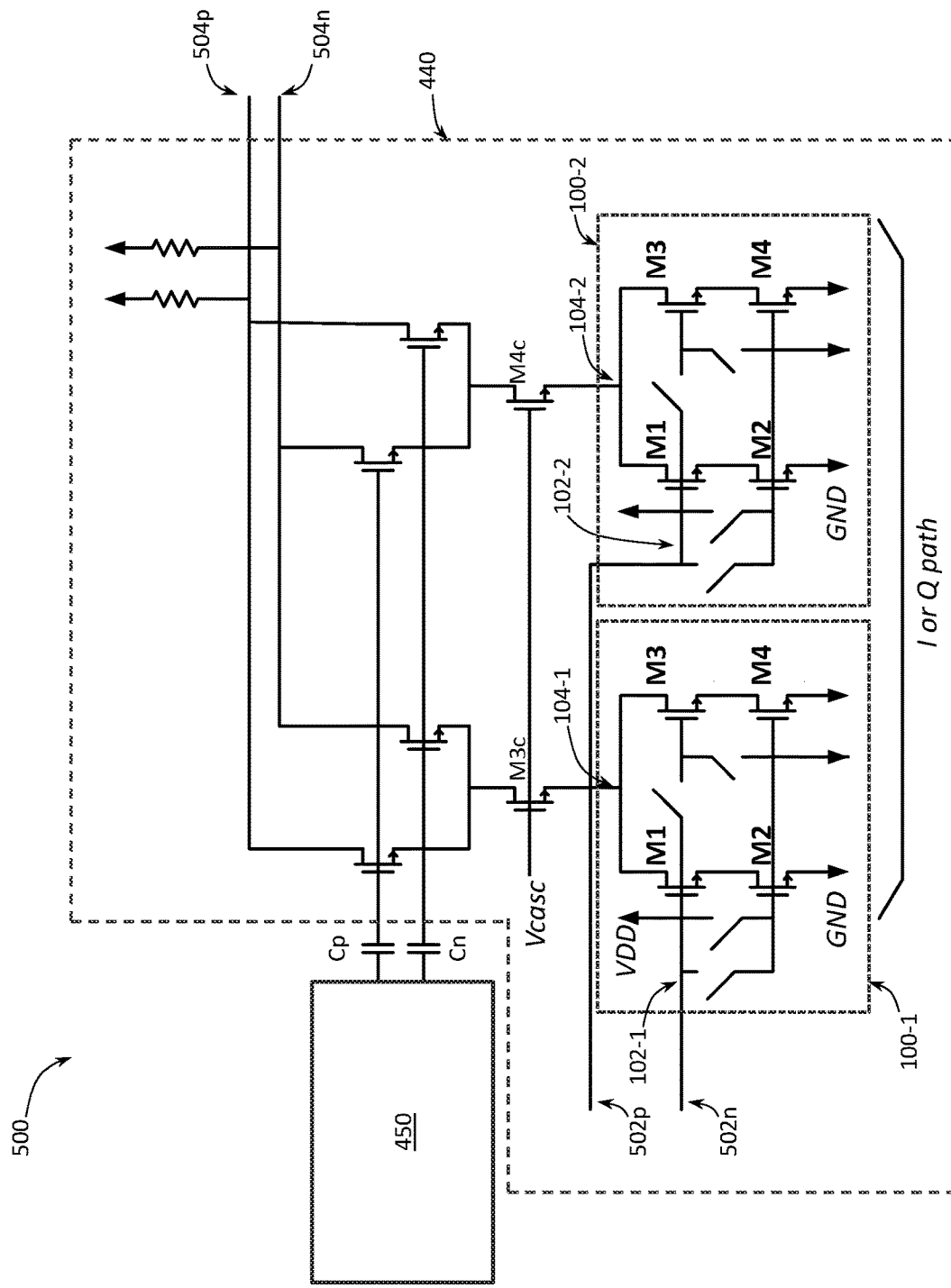
Figure 6:
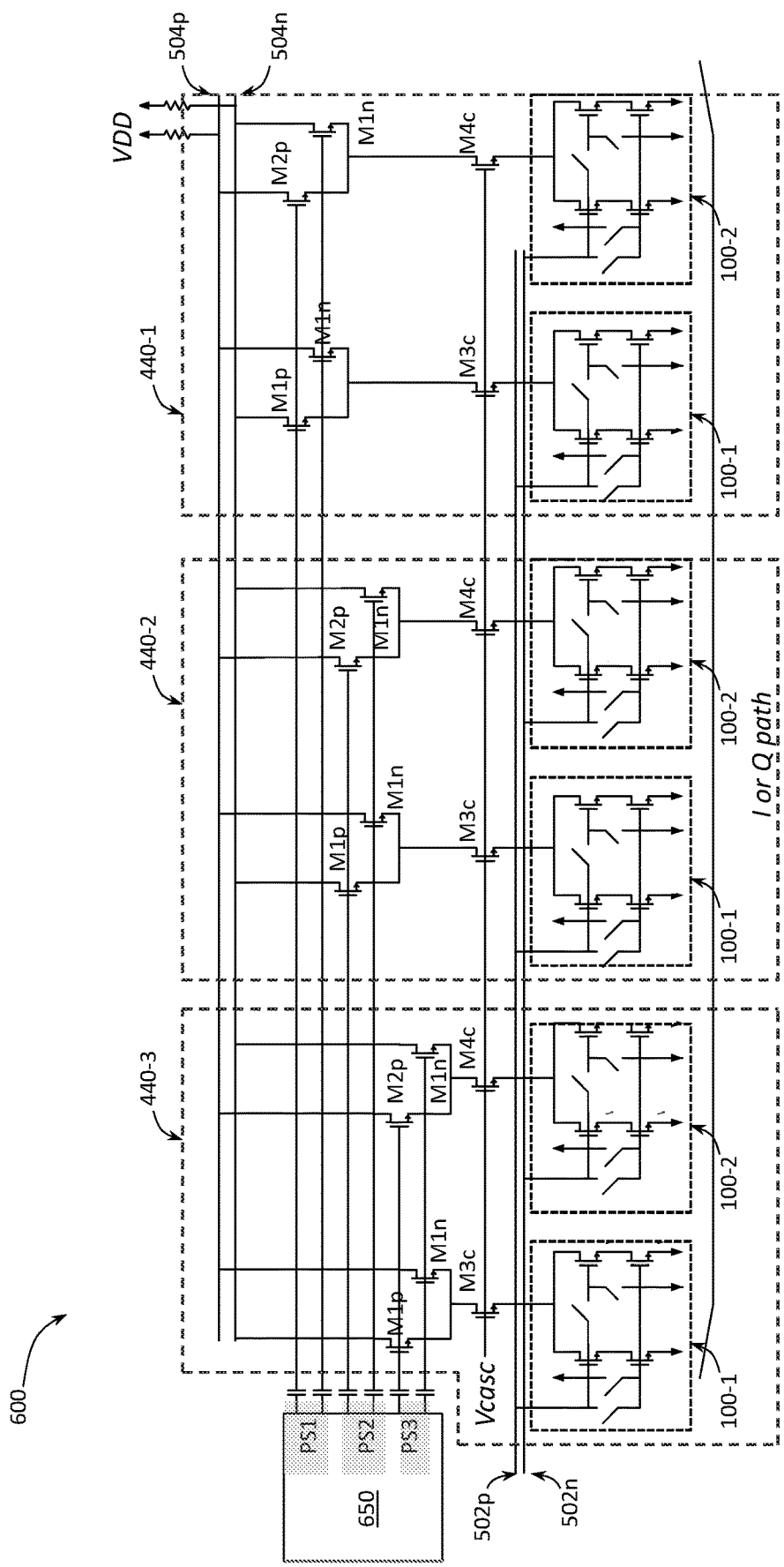
Figure 7:
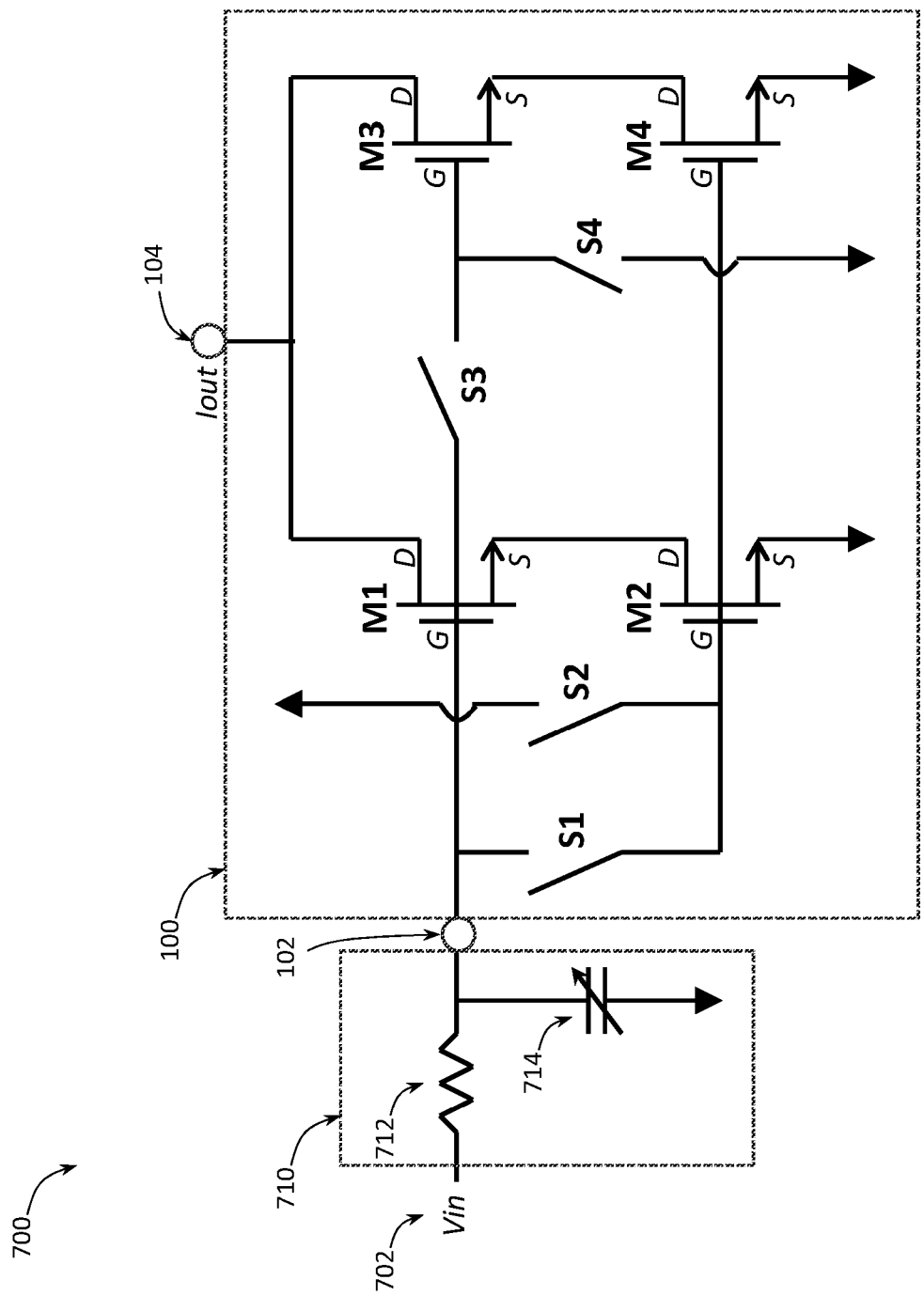
Figure 8:
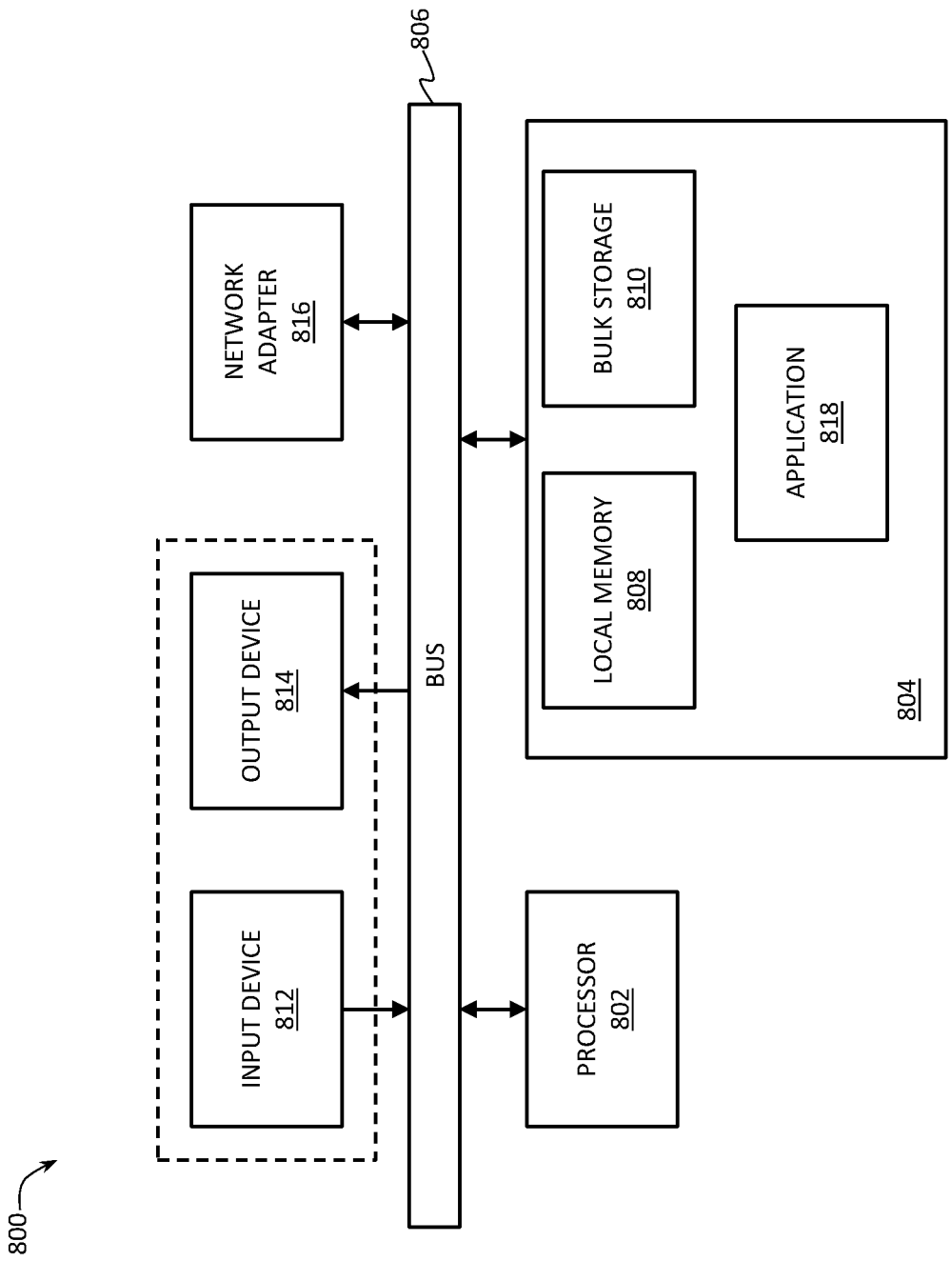

FIG. 3 illustrates an example wireless communication system in which one or more transconductor circuits with programmable tradeoff between bandwidth and flicker noise may be implemented, according to some embodiments of the present disclosure;

FIG. 4 provides a schematic illustration of an RF transmitter in which one or more transconductor circuits with programmable tradeoff between bandwidth and flicker noise may be implemented, according to some embodiments of the present disclosure;

FIGS. 5A and 5B provide schematic illustrations of a portion of an analog TX upconverter of the RF transmitter of FIG. 4 in which two transconductor circuits with programmable tradeoff between bandwidth and flicker noise may be implemented, according to some embodiments of the present disclosure;

FIG. 6 provides a schematic illustration of a portion of an analog TX upconverter of the RF transmitter of FIG. 4 with harmonic rejection, in which six transconductor circuits with programmable tradeoff between bandwidth and flicker noise may be implemented, according to some embodiments of the present disclosure;

FIG. 7 provides an electric circuit diagram of an RF system in which a tuned baseband filter is followed by a transconductor circuit with programmable tradeoff between bandwidth and flicker noise, according to some embodiments of the present disclosure; and FIG. 8 provides a block diagram illustrating an example data processing system that may be configured to control operation of one or more transconductor circuits with programmable tradeoff between bandwidth and flicker noise, according to some embodiments of the present disclosure.

DESCRIPTION OF EXAMPLE EMBODIMENTS OF THE DISCLOSURE

Overview

The systems, methods and devices of this disclosure each have several innovative aspects, no single one of which is solely responsible for the all of the desirable attributes disclosed herein. Details of one or more implementations of the subject matter described in the present disclosure are set forth in the description below and the accompanying drawings.

Embodiments of the present disclosure relate to transconductor circuits with programmable tradeoff between bandwidth and flicker noise, and devices and systems in which such circuits may be implemented. An example transconductor circuit includes an input port, configured to receive an input signal (a voltage signal), an output port, configured to provide an output signal (a current signal), a transistor arrangement that includes a plurality of transistors, and a switch arrangement. The switch arrangement includes a plurality of switches, configured to change coupling between the input port, the output port, and the plurality of transistors to place the transconductor circuit in a first mode of operation or a second mode of operation such that an input capacitance of the transconductor circuit operating in the first mode is larger than an input capacitance of the transconductor circuit operating in the second mode. In the first mode, having a larger input capacitance results in a decreased flicker noise because the amount of flicker noise is inversely proportional to the input capacitance. Therefore, the first mode of operation may be referred to as a "low-noise" mode, which may be particularly advantageous for narrow-bandwidth applications. On the other hand, in the second mode of operation, having a smaller input capacitance leads to an increased flicker noise but that is acceptable for wide-bandwidth applications because wide-bandwidth signals may be less sensitive to flicker noise. Therefore, the second mode of operation may be referred to as a "wide-bandwidth" mode. Thus, in some operating conditions the circuit may be configured to have a reduced flicker noise but at the cost of a higher input capacitance (i.e., in the first mode of operation), which is suitable for narrow-bandwidth (also interchangeably referred to as "narrow-band") applications, while in other operating conditions (i.e., in the second mode of operation) the circuit may be configured to have a lower input capacitance and, consequently, an increased flicker noise, but that is acceptable for wide-bandwidth (also interchangeably referred to as "wide-band") applications. For this reason, such a circuit may be described as having a programmable (i.e., variable) tradeoff between bandwidth and flicker noise.

Transconductor circuits with programmable tradeoff between bandwidth and flicker noise may be particularly advantageous for use in radio systems. Radio systems are systems that transmit and receive signals in the form of electromagnetic waves in the RF range of approximately 3 kiloHertz (kHz) to 300 gigahertz (GHz). Radio systems are commonly used for wireless communications, with cellular technology being a prominent example.

Cellular technology is constantly evolving to support growing widespread wireless technology usage. Recently, popular wireless standardized technology has progressed from Global System for Mobile Communication (GSM) to Wide-band Code Division Multiple Access (WCDMA) to Long Term Evolution (LTE). Cellular systems are deployed in many frequency bands that are defined by a combination of standardization organizations such as the 3d Generation Partnership Project (3GPP) and government-sponsored agencies such as the Federal Communications Commission (FCC). There are both frequency division duplex (FDD) and time division duplex (TDD) variants of frequency allocations that are used in commercial cellular networks. In FDD systems, the uplink and downlink use separate frequency bands at the same time while, in TDD systems, the uplink and downlink use the same frequencies at different times. Transconductor circuits with programmable tradeoff between bandwidth and flicker noise may be used in an RF system of any wireless technology, e.g., LTE, and in both FDD and TDD variants of frequency allocations.

Determination of whether to operate a transconductor circuit with programmable tradeoff between bandwidth and flicker noise in a first or in a second mode may depend on particular implementation details and where a circuit designer finds a balance in value of having reduced flicker noise as opposed to value in being able to operate at wider bandwidths. In some implementations, a narrow-band application may be, e.g., a single LTE carrier with a bandwidth between about 5 MHz and 20 MHz. In some implementations, a wide-band could be a single 3GPP band with the bandwidth ranging from 10 s of MHz to 200 MHz. There is sensitivity to flicker noise in this case because the flicker noise is upconverted to the local oscillator (LO) frequency and may create time-varying LO leakage. In some implementations, there may be multiple LTE carriers within a band but the carriers may be placed non-contiguously within the band. If the LO leakage falls in region with no signal content it may create undesired emissions that violate emissions limits. On the other hand, a wide-band application could span multiple 3GPP bands in some implementations. In this case the flicker noise—and the resulting time-varying LO leakage—may be less important because it may fall out of band and may be suppressed by a duplexer or an antenna filter.

As will be appreciated by one skilled in the art, aspects of the present disclosure, in particular aspects of transconductor circuits with programmable tradeoff between bandwidth and flicker noise as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing RF transmitters, in particular RF frequency mixers used in RF transmitters, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples.

In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. In general, while some drawings provided herein illustrate various aspects of transconductor circuits with programmable tradeoff between bandwidth and flicker noise, and systems in which such circuits may be implemented, details of these systems may be different in different embodiments. For example, transconductor circuits with programmable tradeoff between bandwidth and flicker noise shown in the drawings may have further components included therein, or coupled thereto, which are not specifically shown, such as various resistors, transistors, and capacitors. In another example, details shown in some of the drawings, such as the particular arrangement of transconductor circuits in an RF transmitter, the number of transconductor circuits with programmable tradeoff between bandwidth and flicker noise that may be implemented in an RF transmitter, and the relation between transconductor circuits with programmable tradeoff between bandwidth and flicker noise and other components of an RF transmitter may be different in different embodiments, with the illustrations of the present drawings providing only some examples of how these components may be used together in an RF transmitter. In another example, although some embodiments shown in the present drawings illustrate a certain number of components (e.g., a certain number of transconductor circuits with programmable tradeoff between bandwidth and flicker noise), it is understood that these embodiments may be implemented in an RF transmitter or in any other devices or systems with any number of these components in accordance with the descriptions provided herein.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the terms "circuit" or "circuitry" (which may be used interchangeably) refer to one or more passive and/or active components that are arranged to cooperate with one another to provide a desired function. Sometimes, in the present descriptions, the term "circuit" may be omitted (e.g., a transconductor circuit may be referred to simply as a "transconductor," etc.). If used, the terms "substantially," "approximately," "about," etc., may be used to generally refer to being within +/−20% of a target value, e.g., within +/−10% of a target value, based on the context of a particular value as described herein or as known in the art.

Example Transconductor Circuit

Figure 1:
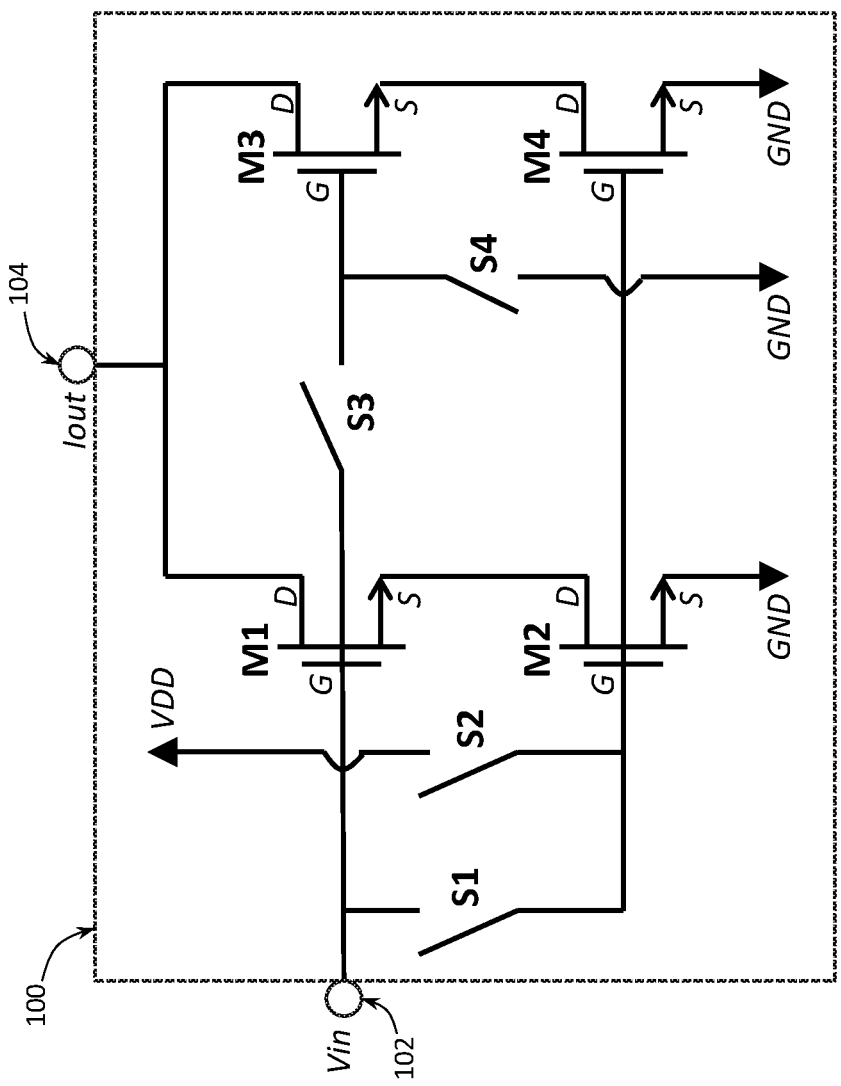
FIG. 1 provides an electric circuit diagram of a transconductor circuit with programmable tradeoff between bandwidth and flicker noise, according to some embodiments of the present disclosure.

FIG. 1 provides an electric circuit diagram of a transconductor circuit 100 with programmable tradeoff between bandwidth and flicker noise, according to some embodiments of the present disclosure. As shown in FIG. 1, the transconductor circuit 100 has an input port 102, configured to receive an input signal Vin (i.e., a voltage signal), and an output port 104, configured to provide an output signal Iout (i.e., a current signal).

The transconductor circuit 100 further includes a transistor arrangement that includes transistors M1-M4, each of which is a field-effect transistor (FET) having a gate terminal (labeled in FIG. 1 with a letter "G"), a drain terminal (labeled in FIG. 1 with a letter "D"), and a source terminal (labeled in FIG. 1 with a letter "5"). The transistors M1-M4 may be common-source transistors. In some embodiments, each of the transistors M1-M4 may be implemented as N-type field-effect transistors (NFETs), as illustrated in FIG. 1 by showing electric circuit diagram representations of NFET transistors for each of the transistors M1-M4. However, in other embodiments, the transconductor circuit 100 may be implemented with the transistors M1-M4 being P-type field-effect transistors (PFETs).

As also shown in FIG. 1, the transconductor circuit 100 further includes a switch arrangement that includes switches S1-S4, coupled between the input port 102, the output port 104, and various ports of the transistors M1-M4, so that the switches S1-S4 may be configured to change coupling between the input port 102, the output port 104, and the plurality of transistors M1-M4 to configure the transconductor circuit 100 for a first mode of operation or for a second mode of operation. In the first mode of operation, the arrangement of the switches S1-S4 and the transistors M1-M4 is such that the input capacitance of the transconductor circuit 100 is larger than an input capacitance of the transconductor circuit 100 operating in the second mode. For example, in some embodiments, the input capacitance of the transconductor circuit 100 operating in the first mode may be about 4 times larger than the input capacitance of the transconductor circuit 100 operating in the second mode. On the other hand, the transconductance of the transconductor circuit 100 may be substantially the same irrespective of whether the transconductor circuit 100 is operating in the first mode or in the second mode.

As shown in FIG. 1, some coupling between various elements of the transconductor circuit 100 is set and some coupling is variable depending on the state of the switches S1-S4, the latter defining whether the transconductor circuit 100 is configured for operating in the first mode or in the second mode. The variable coupling is described below with reference to FIGS. 2A and 2B. The set coupling includes, e.g., that the gate terminal of the transistor M1 is coupled to the input port 102, the drain terminal of the transistor M1 is coupled to each of the drain terminal of the transistor M3 and to the output port 104 (i.e., both the drain terminal of the transistor M1 and the drain terminal of the transistor M3 are coupled to the output port 104), and that the source terminal of the transistor M1 is coupled to the drain terminal of the transistor M2. The set coupling further includes that the gate terminal of the transistor M4 is coupled to the gate terminal of the transistor M2, the drain terminal of the transistor M4 is coupled to the source terminal of the transistor M3, and the source terminal of the transistor M4 is coupled to a ground potential (labeled in FIG. 1 as "GND"). The set coupling further includes that the switch S1 is coupled in a signal path between the input port 102 and the gate terminal of the transistor M2. Phrased differently, the switch S1 is coupled in a signal path between the gate terminal of the transistor M1 and the gate terminal of the transistor M2, because the gate terminal of the transistor M1 is coupled to the input port 102, or the switch S1 is coupled in a signal path between the input port 102 and/or the gate terminal of the transistor M1 and the gate terminal of the transistor M4, because the gate terminal of the transistor M4 is coupled to the gate terminal of the transistor M2. The set coupling also includes that the switch S2 is coupled in a signal path between a positive supply voltage (labeled in FIG. 1 as "VDD") and/or the gate terminal of the transistor M2 and/or the gate terminal of the transistor M4. With respect to the switch S3, the set coupling includes that the switch S3 is coupled between the gate terminal of the transistor M1 and the gate terminal of the transistor M3. With respect to the switch S4, the set coupling includes that the switch S4 is coupled between the gate terminal of the transistor M3 and a ground potential. The set coupling also includes that each of the source terminal of the transistor M2 and the source terminal of the transistor M4 is coupled to a ground potential.

Each of the switches S1-S4 is configured to be either in a first state or in a second state. The first state of a switch is a state that allows conduction of current through the switch. For example, the first state may be what is conventionally referred to as a switch being "closed." If a switch is implemented as a FET, as any of the switches S1-S4 may be (although it is not specifically shown in FIG. 1), this means that the first state is a state where the difference between the source and drain terminals of the switch is substantially zero (or is sufficiently small, as known in the art). The second state of a switch is a state that does not allow substantial conduction of current through the switch. For example, the second state may be what is conventionally referred to as a switch being "open." In this context, describing that the state does not allow "substantial conduction of current" refers to the fact that, even though there is not supposed to be any current conducted through the switch, there may still be some unintentional current, e.g., transistor leakage current if a switch is implemented as a transistor. In the following, for simplicity, the switches are referred to as being closed or open.

Figure 2A:
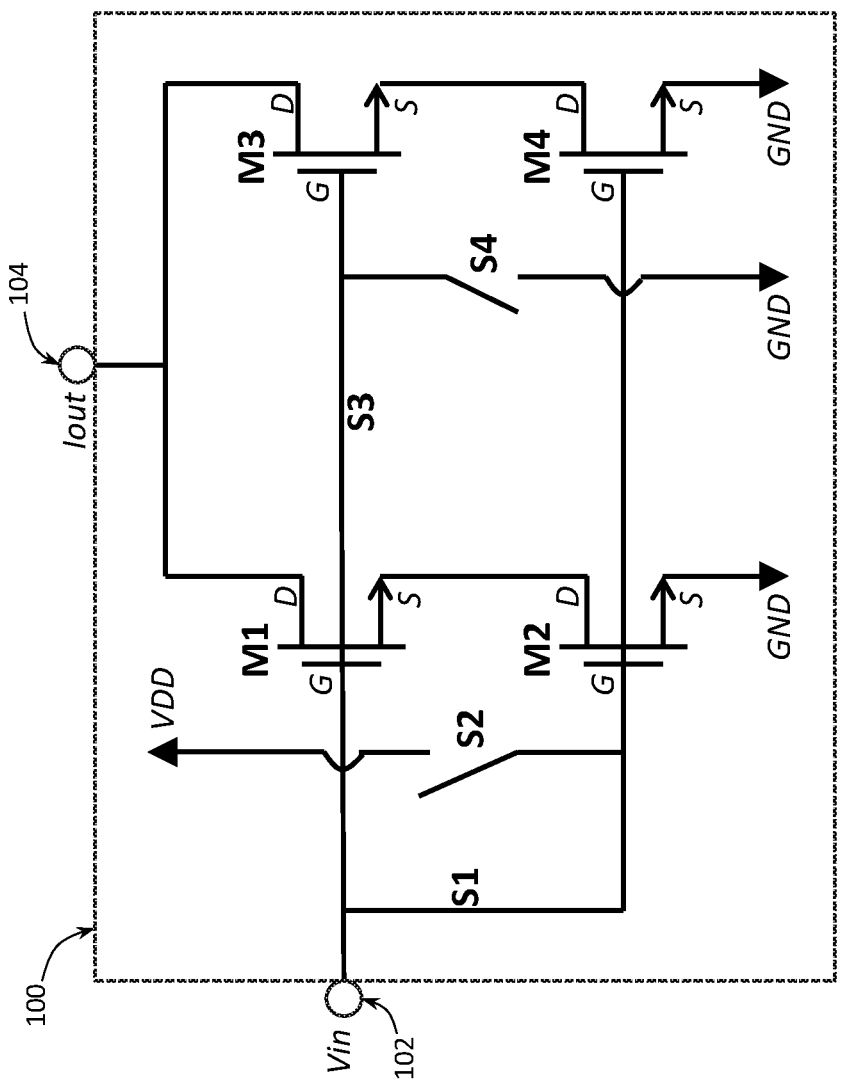
FIG. 2A provides an electric circuit diagram of the transconductor circuit of FIG. 1 configured for operating in a low-noise mode, according to some embodiments of the present disclosure.
Figure 2B:
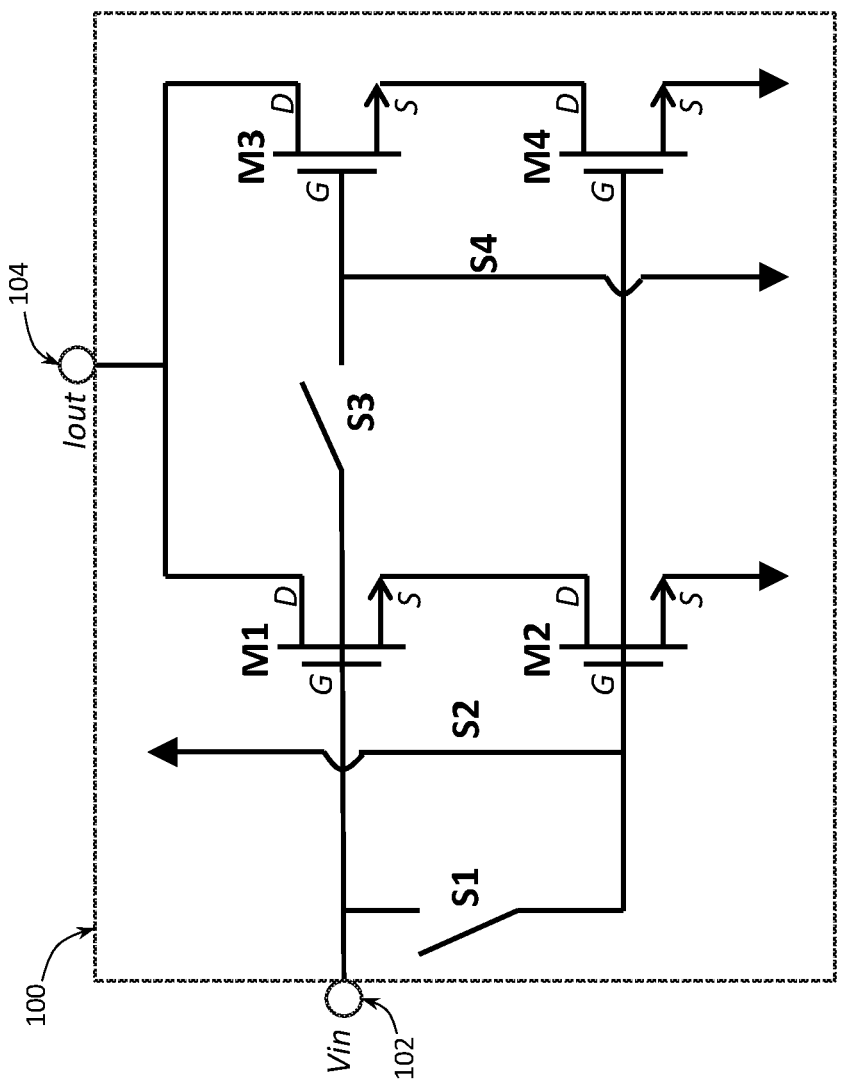
FIG. 2B provides an electric circuit diagram of the transconductor circuit of FIG. 1 configured for operating in a wide-bandwidth mode, according to some embodiments of the present disclosure.

Together, the states of the individual switches S1-S4 define whether the transconductor circuit 100 is configured for the first mode or the second mode of operation. FIG. 2A provides an electric circuit diagram of the transconductor circuit 100 that has been configured for operating in the first mode (i.e., the low-noise mode), while FIG. 2B provides an electric circuit diagram of the transconductor circuit 100 that has been configured for operating in the second mode (i.e., the wide-bandwidth mode), according to some embodiments of the present disclosure.

In the first mode of operation, all of the transistors M1-M4 are active (i.e., on). As shown in FIG. 2A, in the first mode of operation, the switches S1 and S3 are closed, while the switches S2 and S4 are open. Thus, in the first mode of operation, the switch arrangement is configured to couple the input port 102 (and, hence, the gate terminal of the transistor M1) to the gate terminal of each of the transistor M2 and the transistor M4 by virtue of the switch S1 being closed. By virtue of the switch S3 being closed, the input port 102 (and, hence, the gate terminal of the transistor M1) is coupled to the gate terminal of the transistor M3. Thus, in the first mode of operation, the gate terminal of each of the transistors M1-M4 is coupled to the input port 102, and the gate terminals of the transistors m1-M4 are coupled to one another. By virtue of the switch S2 being open, the gate terminal of the transistor M2 is not coupled to the positive supply voltage, and by virtue of the switch S4 being open, the gate terminals of the transistors M1 and M3 are not coupled to the ground potential. In the first mode configuration of the transconductor circuit 100, the transistor M1 is in electrical parallel with the transistor M3, and the transistor M2 is in electrical parallel with the transistor M4. The transistors M1 and M2 now have substantially the same gate voltage so these two transistors are effectively a single transistor having the same channel width but double the channel length as each of these transistors. Assuming that the transistors M1-M4 may be implemented as substantially identical transistors (notwithstanding potential unintentional processing variations), having a channel width of W and having a channel length of L, when the transconductor circuit 100 is configured for the first mode of operation, the transistors M1 and M2 are effectively a single W/2L transistor. Furthermore, when the transconductor circuit 100 is configured for the first mode of operation, the transistors M1 and M2 are in parallel with two identically biased and sized transistors so the effective size may be 2 W/2L or W/L, which is the same as that of the transistor M1 in the wide-bandwidth mode. In this manner, the effective area of the transconductor circuit 100 may be increased to 4*W*L, which may advantageously reduce the flicker noise by 6 decibel (dB) compared to the wide-bandwidth mode configuration of the transconductor circuit 100. The lower flicker noise comes at the expense of a higher input capacitance (e.g., about 4 times higher, for the example described above, where the input capacitance of the transconductor circuit 100 in the first mode may be 4*W*L*Cox, where Cox is the oxide capacitance of the gate oxide of the transistors M1-M4). However, for narrow-bandwidth applications the higher input capacitance is acceptable and far outweighs the advantages of the lower flicker noise. That is why the transconductor circuit 100 may be configured to operate in the first mode when the input signal Vin is a narrow-bandwidth signal.

In the second mode of operation, only the transistor M1 is active and the transistors M2-M4 are inactive (i.e., off). As shown in FIG. 2B, in the second mode of operation, the switches S1 and S3 are open, while the switches S2 and S4 are closed. In the second mode of operation, the switch arrangement is configured to couple the gate terminal of the transistor M2 to the positive supply voltage by virtue of the switch S2 being closed, and to couple the gate terminal of the transistor M3 to the ground potential by virtue of the switch S4 being closed. By virtue of the switch S1 being open, the gate terminals of the transistors M2 and M4 are not coupled to the input port 102 or the gate terminal of the transistor M1. By virtue of the switch S3 being open, the gate terminal of the transistor M3 is not coupled to the input port 102 or the grate terminal of the transistor M1. As shown in FIG. 2B, in the second mode, the input port 102 is still coupled to the gate terminal of the transistor M1, and the gate terminal of each of the transistor M2, the transistor M3, and the transistor M4 is coupled to a ground potential. When the transconductor circuit 100 is operated in the second mode, the transistors M3 and M4 may be off, the transistor M2 may be in a triode mode and may effectively act as a small resistor, and the transistor M1 may be in saturation, having a transconductance gm. Again, assuming that each of the transistors M1-M4 has a channel width W and a channel length L, the input capacitance of the transconductor circuit 100 in the second mode is W*L*Cox, where Cox is the oxide capacitance of the gate oxide of the transistors M1-M4. Lower effective device area of the transconductor circuit 100 operating in the second mode comes at the cost of higher flicker noise. However, for wide-bandwidth applications the higher flicker noise is acceptable and far outweighs the advantages of having the lower input capacitance. That is why the transconductor circuit 100 may be configured to operate in the second mode when the input signal Vin is a wide-bandwidth signal.

While some values for the device area and, correspondingly, input capacitance have been given above with reference to the transistors M1-M4 being implemented as substantially identical transistors that was only to simplify these explanations. In general, the transconductor circuit 100 may be implemented with the transistors M1-M4 being implemented as transistors of any geometry/size, with the computations of the effective device area and input capacitance being correspondingly different, all of which embodiments being within the scope of the present disclosure. How to compute an effective device area and input capacitance of a circuit is known to a person of ordinary skill in the art and, therefore, in the interests of brevity, is not explained here.

The transconductor circuit 100 has many applications. For example, in some embodiments, the output port 104 of the transconductor circuit 100 may be connected to a resistor or to active devices that effectively form a resistance to create a gain stage. In other examples, the transconductor circuit 100 may be used in variable gain-amplifiers, continuous-time filters, delta-sigma modulators, or data converters. One particularly useful application of the transconductor circuit 100 is in an RF transmitter of a cellular wireless communication system, where some examples of such application will now be described in greater detail.

Example Wireless Communication System

One or more of the transconductor circuits 100 may be implemented in a radio system. FIG. 3 illustrates an example wireless communication system 300 in which one or more transconductor circuits 100 with programmable tradeoff between bandwidth and flicker noise may be implemented according to some embodiments of the present disclosure. The wireless communication system 300 may include a base station 310 and a plurality of mobile stations, examples of which are shown in FIG. 3 as a first mobile station 320, a second mobile station 330, and a third mobile station 340. The base station 310 may be coupled to backend network (not shown) of the wireless communication system and may provide communication between the mobile stations 320-340 and the backend network. In various embodiments, the wireless communication system 300 may include a plurality of base stations similar to the base station 310, which base stations may, e.g., be arranged in cells, where only one base station 310 is shown in FIG. 3 for simplicity and illustration purposes.

The wireless communication system 300 may support multiple standards and multiple band communication. For example, the wireless communication system may support LTE, WCDMA, and GSM standard communication. Each of the mobile stations 320-340 may support any one or more of these standards. However, the use of these listed standards is merely exemplary and other standards also may be supported by different parts of the wireless communication system 300. In addition to multiple standard capabilities, the wireless communication system 300 may also support multiple communication bands. For example, the wireless communication system 300 may support DCS/PCS bands and GSM850/GSM900 bands of GSM.

The base station 310 may support wireless communication with mobile stations 320-340 of various standard technologies as well as in multiple bands. The base station 310 may transmit signals to the mobile stations 320-340 in downlink signals and receive signals from the mobile stations 320-340 in uplink signals. For example, the base station 310 may receive LTE compliant signals from the first mobile station 320, WCDMA signals from the second mobile station 330, and GSM signals from the third mobile station 340. The base station 310 may convert the received signals to baseband signals, possibly by first converting them to IF signals, or low-IF signals, to demodulate and extract information from therein.

Example RF Transmitters

FIG. 4 provides a schematic illustration of an RF transmitter 400 in which one or more transconductor circuits 100 with programmable tradeoff between bandwidth and flicker noise may be implemented, according to some embodiments of the present disclosure. For example, the RF transmitter 400 may be provided in the base station 310 of FIG. 3. In another example, the RF transmitter 400 may be provided in any of the mobile stations 320-340 of FIG. 3.

As shown in FIG. 4, the RF transmitter 400 may include a controller 405, a digital block 410, a pair of digital-to-analog converters (DACs) 420-1 and 420-2, a pair of filters 430-1 and 430-2, a pair of TX path mixers 440-1 and 440-2, a LO 450, and an RF variable gain amplifier 460. Optionally, the RF transmitter 400 may further include a feedback path that may include a loopback circuit 470, an analog-to-digital converter 480, and an observation circuit 490. In some embodiments, two or more components of the RF transmitter 400 may be provided monolithically, e.g., on a single substrate or in a single integrated circuit (IC).

In various embodiments, the controller 405 may either be included within the RF transmitter 400, or be external, but communicatively coupled, to the RF transmitter 400. The controller 405 may include any suitable device, configured to control operation of various parts of the RF transmitter 400. For example, in various embodiments, the controller 405 may control whether any of the transconductor circuits 100 implemented in the RF transmitter 400 are operating in the first mode or in the second mode. In some embodiments, the controller 405 may further control other aspects, components, and features of the RF transmitter 400 or/and the transconductor circuit 100, described herein. In some embodiments, the controller 405 may be implemented as, or include portions of, a data processing system shown in FIG. 8.

The digital block 410 may be configured to perform various functions related to digital processing of the TX signals so that information can be encoded in the TX signals (the digital block 220 may also be referred to as a "digital signal processing circuit"). In some embodiments, the digital block 410 may be what is known in the art as "PHY," which commonly refers to circuitry used to perform physical layer functions.

FIG. 4 illustrates that, in some embodiments, the RF transmitter 400 may be configured to perform quadrature processing. To that end, a quadrature digital signal to be transmitted (i.e., the TX signal) may be provided, from the digital block 410, to the DACs 420-1 and 420-2, configured to convert, respectively, digital in-phase (I) and quadrature phase (Q) TX signal components to analog form.

Optionally, the outputs of the DACs 420-1 and 420-2 may be coupled to respective filters 430-1 and 430-2, which may be band-pass filters, configured to filter out, from the analog TX signals output by the DACs 420-1 and 420-2, the signal components outside of the desired band (e.g., to filter out components outside of the baseband).

The digital TX signals may then be provided to the TX path quadrature mixer 440 that includes a pair of TX path mixers 440-1 and 440-2. Each of the TX path mixers 440-1 and 440-2 may include two inputs and one output. A first input may receive the TX signal components, converted to the analog form by the respective DAC 420, which are to be upconverted to generate RF signals to be transmitted. A second input of each of the TX path TX path mixers 440-1 and 440-2 may be coupled the LO 450. The LO 450 may generate LO signals at different frequencies. The different frequencies may be selected based, e.g., on the current signal properties for multi-band TX signals and frequency bands included therein. At least some parts of the functionality of the LO 450, e.g., the frequency of the oscillation signal generated by the LO 450, may be controlled by the controller 405. The first TX path mixer 440-1 may generate an in-phase (I) upconverted signal by mixing the TX signal component converted to analog form by the DAC 420-1 with the in-phase component of the LO signal generated by the LO 450 (i.e., cos(LO), labeled in FIG. 4 at the second input to the first TX path mixer 440-1). The second TX path mixer 440-2 may generate a quadrature phase (Q) upconverted signal by mixing the TX signal component converted to analog form by the DAC 420-2 with the quadrature component of the LO signal generated by the LO 450 (i.e., sin(LO), labeled in FIG. 4 at the second input to the second TX path mixer 440-2, which is a component that is offset, in phase, from the in-phase component of the LO signal by 90 degrees).

The TX path mixers 440 may be the dominant source of flicker noise. Since, as described above, it takes a large input capacitance device to meet the flicker noise targets, one or both of the TX path mixers 440 may include one or more of the transconductor circuits 100 that can operate in two modes. This is suitable for the RF transmitter 400 because in the most power sensitive single-band applications the LO signal will be in-band. In wider bandwidth modes the LO signal may be arranged to be out-of-band where it can be filtered. There may be two possible scenarios where implementing one or more of the transconductor circuits 100 in any of the TX path mixers 440 may be particularly advantageous. In a first scenario, there is no signal content near DC where the flicker noise is. In this case the RF transmitter 400 is configured in a wide-bandwidth intermediate frequency (IF) or low-IF configuration. In a second scenario, the signal itself may have content at DC and the signal power will be large compared to the flicker noise power.

The RF transmitter 400 provides a simplified version and, in further embodiments, other components not specifically shown in FIG. 4 may be included. For example, although not specifically shown in FIG. 4, the RF signal 462 may be provided to further components of the TX path, such as a transformer (e.g., a balun matching transformer, configured to convert the differential signal to a single-ended signal), a power amplifier, and finally an antenna port of an antenna that will wirelessly transmit the TX signal generated by the power amplifier.

The DAC 420-1, the filter 430-1, and the TX path mixer 440-1 may be referred to as an I-path of the quadrature processing of the TX signals, while the DAC 420-2, the filter 430-2, and the TX path mixer 440-2 may be referred to as a Q-path of the quadrature processing of the TX signals. As shown in FIG. 4, in some embodiments, each of the DACs 420 may be configured to receive a single-ended signal from the digital block 410, but then output differential signals, while each of the filters 430 and the TX path mixers 440 may be configured to receive differential inputs and generate differential outputs.

FIGS. 5A and 5B provide schematic illustrations of a portion of an analog TX upconverter 500 of the RF transmitter 400 of FIG. 4 in which two transconductor circuits 100 may be implemented, according to some embodiments of the present disclosure. The TX upconverter 500 may be seen as a combination of the LO 450 and the TX path quadrature mixer 440 of the RF transmitter 400. Because, as described above, the RF transmitter 400 is shown in FIG. 4 as performing quadrature processing, the TX upconverter 500 shown in FIG. 5 is just one of the two instances of such stages that may be implemented in the RF transmitter 400—either one for the I-path or one for the Q-path.

As shown in FIG. 5A, in some embodiments, the output of the LO 450 may be coupled to the TX path quadrature mixer 440 via a pair of capacitors, one of the capacitors denoted as a capacitor "Cp" for one of the two differential outputs of the LO 450 (where "p" stands for "positive" or "non-inverting" part of a differential output) and the other one of the capacitors denoted as a capacitor "Cn" for the other one of the two differential outputs of the LO 450 (where "n" stands for "negative" or "inverting" part of a differential output).

In the positive path of the differential output from the LO 450, the output of the capacitor Cp may be coupled to a pair of transistors M1p and M2p, while, in the negative path of the differential output from the LO 450, the output of the capacitor Cn may be coupled to a pair of transistors M1n and M2n, as shown in FIG. 5A. Each of the transistors M1p, M2p, M1n, and M2n may be implemented as a FET having gate, source, and drain terminals, labeled in FIG. 5A as G, S, and D, respectively but only for the transistor M1p, in order to not clutter the drawing. As shown in FIG. 5A, the output of the capacitor Cp may be coupled to the gate terminal of each of the transistors M1p and M2p, while the output of the capacitor Cn may be coupled to the gate terminal of each of the transistors M1n and M2n.

As also shown in FIG. 5A, the TX upconverter 500 may include a pair of cascode transistors M3c, M4c, each of which may also be implemented as a FET having gate, source, and drain terminals (not labeled in FIG. 5A in order to not clutter the drawing because which terminal is which is apparent from the electric circuit diagram sign used to illustrate these transistors, as is shown for the example of the transistor M1p). A DC bias voltage Vcasc may be applied to each of the gate terminals of the transistors M3c and M4c, as shown in FIG. 5A. The source terminal of the transistor M3c may be coupled to the output port 104 of a transconductor circuit 100-1, which is the first instance of the transconductor circuit 100 described herein. The source terminal of the transistor M4c may be coupled to the output port 104 of a transconductor circuit 100-2, which is the second instance of the transconductor circuit 100 described herein. The drain terminal of the transistor M3c may be coupled to the source terminals of each of the transistor M1p and M1n, while the drain terminal of the transistor M4c may be coupled to the source terminals of each of the transistor M2p and M2n. The drain terminal of each of the transistors M1p and M2n may be coupled to each of the positive supply voltage VDD and a first differential output 504p (e.g., the positive/non-inverting output of the TX path quadrature mixer 440), while drain terminal of each of the transistors M1n and M2p may be coupled to each of the positive supply voltage VDD and a second differential output 504n (e.g., the negative/inverting output of the TX path quadrature mixer 440).

Two transconductor circuits 100 are shown in FIG. 5A because one may be used in the positive path of the baseband signal to be provided as an input to the TX path quadrature mixer 440 (e.g., from the positive output of the differential output from the TX baseband filter 430), while the other one may be used in the negative path of the baseband signal to be provided as an input to the TX path quadrature mixer 440 (e.g., from the negative output of the differential output from the TX baseband filter 430). For example, as shown in FIG. 5A, 502n may be the negative output of the differential output from the TX baseband filter 430, and it may be coupled to the first transconductor circuit 100-1, while 502p may be the positive output of the differential output from the TX baseband filter 430, and it may be coupled to the second transconductor circuit 100-2.

FIG. 5B provides an illustration of the TX upconverter 500 that is substantially identical to that shown in FIG. 5A (except that some elements labeled in FIG. 5A are not labeled again in FIG. 5B in order to not clutter the drawing), but now also showing the details of the transconductor circuits 100-1 and 100-2. As shown in FIG. 5B, the output 502p may be coupled to the input 102-2 of the second transconductor circuit 100-2, while the output 502n may be coupled to the input 102-1 of the first transconductor circuit 100-1. FIG. 5B only labels the transistors M1-M4 in each of the transconductor circuits 100 shown, but not the switches S1-S4 in order to not clutter the drawings. However, each of the transconductor circuits 100-1 and 100-2 is implemented as the transconductor circuit 100 shown in FIG. 1. Similarly, in order to not clutter the drawing, FIG. 5B labels VDD and GND only in some instances, but all black arrows pointing upwards in FIG. 5B are intended to illustrate the positive supply voltage VDD, while all black arrows pointing downwards in FIG. 5B are intended to illustrate the ground voltage GND (the same applies to FIG. 6). FIG. 5B further illustrates that the source terminal of the transistor M3c is coupled to the output 104-1 of the first transconductor circuit 100-1, while the source terminal of the transistor M4c is coupled to the output 104-2 of the second transconductor circuit 100-2.

To summarize the use of the transconductor circuits 100-1, 100-2 in the TX upconverter 500, the TX upconverter 500 is the load of the TX baseband signal which limits the allowable input capacitance and/or bandwidth. Flicker noise may be more important in single-band applications because the LO signal of the LO 450 is in-band in those cases. Therefore, the flicker noise requirements may be relaxed in wide-bandwidth applications. Utilizing the transistors M1-M4 of the transconductor circuits 100-1 and 100-2 allows taking advantage of this in that in low-noise mode all transistors M1-M4 are active, the effective ratio of channel width to channel length is 2 W/2L=W/L and the effective area of the transconductor circuit 100 is 4 WL, while in wide-bandwidth (low-capacitance) mode just one transistor is active (namely, transistor M1), the effective ratio of channel width to channel length is W/L and the effective area of the transconductor circuit 100 is W*L, reducing the input capacitance (e.g., by a factor of about 4), while keeping all other parameters fixed. The signals provided to the inputs 102-1 and 102-2 of the first and second transconductor circuits 100-1, 100-2 are voltage baseband signals which are converted by the transconductor circuits 100-1, 100-2 to current signals provided at the outputs 104-1 and 104-2 of the first and second transconductor circuits 100-1, 100-2. The current signals at the outputs 104-1 and 104-2 may be passed through the cascode transistors M3c and M4c into the mixer where the baseband or IF signal is upconverted to the desired RF frequency. The signal output of the TX upconverter 500 (i.e., the signal at the outputs 504p and 504n) is the RF voltage signal, or, in case multiple stages of upconversion are used, an upconverted signal having a frequency higher than that of the baseband signal provided at the inputs 502p and 502n. The signal output of the TX upconverter 500 may then be provided to the RF VGA 460.

Because the TX upconverter 500 is either for the I-path or the Q-path of the RF transmitter 400, in practice, the RF transmitter 400 may include two instances of the TX upconverter 500 (one for the I-path and one for the Q-path of the RF transmitter 400) and, hence, four instances of the transconductor circuit 100 of FIG. 1 (two for the I-path, where one is used for the positive/non-inverting signal path and the other one is used for the negative/inverting signal path of the I-path, and two for the Q-path, where one is used for the positive/non-inverting signal path and the other one is used for the negative/inverting signal path of the Q-path). In further embodiments, even more transconductor circuits 100 of FIG. 1 may be used within the TX upconverter 500 of the RF transmitter 400. One example of such an embodiment is shown in FIG. 6, for the scenario where the TX upconverter 500 is configured to implement harmonic rejection.

FIG. 6 provides a schematic illustration of a portion of an analog TX upconverter 600 of the RF transmitter 400, where the TX upconverter 600 is configured to implement harmonic rejection and may use six transconductor circuits 100, according to some embodiments of the present disclosure. The TX upconverter 600 includes an LO 650. The LO 650 is similar to the LO 450 described with reference to FIGS. 5A-5B, except that instead of providing one differential output as shown in FIGS. 5A-56, the LO 650 is configured to provide a plurality of differential outputs where the LO signals output at different outputs have different phase shifts. For example, as shown in FIG. 6, the LO 650 may provide a first output with a phase shift PS1 (the top two lines from the LO 650 shown in FIG. 6), a second output with a phase shift PS2 (the middle two lines from the LO 650 shown in FIG. 6), and a third output with a phase shift PS3 (the bottom two lines from the LO 650 shown in FIG. 6). For example, in some embodiments, PS1 may be 45 degrees, PS2 may be 0 degrees, and PS3 may be −45 degrees. Similar to how a single differential output of the LO 450 shown in FIGS. 5A-5B is coupled to the TX path quadrature mixer 440 to enable the TX path quadrature mixer 440 to generate an upconverted output signal at the outputs 504p and 504n, each of the 3 differential outputs of the LO 650 shown in FIG. 6 is coupled to a respective different instance of the TX path quadrature mixer 440, shown in FIG. 6 as 440-1, 440-2, and 440-3. In particular, as is shown in FIG. 6, the output PS1 may be coupled to the TX path quadrature mixer 440-1 via a first pair of capacitors Cp and Cn, the output PS2 is coupled to the TX path quadrature mixer 440-2 via a second pair of capacitors Cp and Cn, and the output PS3 is coupled to the TX path quadrature mixer 440-3 via a third pair of capacitors Cp and Cn. The individual capacitors of each pair are not labeled in FIG. 6 in order to not clutter the drawing but, for each of the pairs shown in FIG. 6, these capacitors may be analogous to that shown in FIG. 5.

Besides that each of the 3 TX path quadrature mixers 440 of the TX upconverter 600 being configured to receive LO signal with different phase shifts, the coupling and functionality of each of the TX path quadrature mixers 440 shown in FIG. 6 is substantially analogous to that shown in FIG. 5, and, therefore, the descriptions provided with respect to FIG. 5 are applicable to each of the TX path quadrature mixers 440 of FIG. 6. Different instances of the TX path quadrature mixers 440 shown in FIG. 6 are configured to receive the same baseband signal as an input (in particular, where the first transconductance circuit 100-1 of each of the TX path quadrature mixers 440 shown in FIG. 6 is configured to receive the output 502p as an input, while the second transconductance circuit 100-2 of each of the TX path quadrature mixers 440 shown in FIG. 6 is configured to receive the output 502n as an input). The outputs of the different instances of the TX path quadrature mixers 440 shown in FIG. 6 are coupled together to the outputs 504p and 504n. Together, the three TX path quadrature mixers 440 shown in FIG. 6 implement a harmonic reject mixer. The TX upconverter 600 may be advantageous in that it may suppress the $3^{rd}$ and $5^{th}$ harmonics of the LO signal, which may improve in terms of the linearity required in the following stages of the RF transmitter 400 and may advantageously reduce out-of-band emissions.

Because the TX upconverter 600 is either for the I-path or the Q-path of the RF transmitter 400, in practice, the RF transmitter 400 may include two instances of the TX upconverter 600 (one for the I-path and one for the Q-path of the RF transmitter 400) and, hence, twelve instances of the transconductor circuit 100 of FIG. 1 (six transconductor circuits 100 implemented as shown in FIG. 6 for the I-path and six transconductor circuits 100 implemented as shown in FIG. 6 for the Q-path).

Another example deployment scenario for the transconductor circuit 100 is shown in FIG. 7, providing an electric circuit diagram of an RF system 700 in which a tuned baseband filter 710 is followed by the transconductor circuit 100, according to some embodiments of the present disclosure. As shown in FIG. 7, the filter 710 may be a low-pass filter with a single pole and may include a resistive element 712, coupled between an input port 702 of the filter 710 and input terminal 102 of the transconductor circuit 100 (in particular, the gate terminal of the transistor M1 of the transconductor circuit 100). The filter 710 may further include a capacitor 714 (e.g., a variable capacitor), coupled between the input port 102 or the gate terminal of the transistor M1 and the ground potential. In other embodiments, the filter 710 may be implemented as a higher-order filter than that shown in FIG. 7. In such a configuration, the driving circuit has a finite non-zero output impedance and so the bandwidth is limited by the input capacitance of the transconductance stage of the transconductor circuit 100. In narrow-bandwidth applications—which are more sensitive to flicker noise—the value of the capacitor 714 may be set to be relatively large and so the input capacitance of transconductor 100 can also be relatively large. In wide-bandwidth applications, the value of the capacitor 714 may be set to be relatively small and so the input capacitance of transconductor 100 may also be relatively small. Configuring the transconductor in the low-input capacitance mode allows the bandwidth tuning range to be wider.

Example Data Processing System

FIG. 8 provides a block diagram illustrating an example data processing system 800 that may be configured to control operation of one or more transconductor circuits 100 with programmable tradeoff between bandwidth and flicker noise, according to some embodiments of the present disclosure. For example, the data processing system 800 may be configured to implement or control portions of one or more of the transconductor circuits 100 implemented in devices shown in FIGS. 4-7. In another example, the data processing system 800 may be configured to implement at least portions of the controller 405.

As shown in FIG. 8, the data processing system 800 may include at least one processor 802, e.g. a hardware processor 802, coupled to memory elements 804 through a system bus 806. As such, the data processing system may store program code within memory elements 804. Further, the processor 802 may execute the program code accessed from the memory elements 804 via a system bus 806. In one aspect, the data processing system may be implemented as a computer that is suitable for storing and/or executing program code. It should be appreciated, however, that the data processing system 800 may be implemented in the form of any system including a processor and a memory that is capable of performing the functions described within this disclosure.

In some embodiments, the processor 802 can execute software or an algorithm to perform the activities as discussed in the present disclosure, in particular activities related to programmable tradeoff between bandwidth and flicker noise of one or more transconductor circuits, e.g., the transconductor circuit 100, as described herein. The processor 802 may include any combination of hardware, software, or firmware providing programmable logic, including by way of non-limiting example a microprocessor, a digital signal processor (DSP), a field-programmable gate array (FPGA), a programmable logic array (PLA), an application specific IC (ASIC), or a virtual machine processor. The processor 802 may be communicatively coupled to the memory element 804, for example in a direct-memory access (DMA) configuration, so that the processor 802 may read from or write to the memory elements 804.

In general, the memory elements 804 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 800 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements of the RF transmitters or portions thereof, shown in FIGS. 4-7, can also include suitable interfaces for receiving, transmitting, and/or otherwise communicating data or information in a network environment so that they can communicate with, e.g., the data processing system 800.

In certain example implementations, mechanisms for implementing transconductor circuits with programmable tradeoff between bandwidth and flicker noise as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 804 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 802 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 804 may include one or more physical memory devices such as, for example, local memory 808 and one or more bulk storage devices 810. The local memory may refer to RAM or other non-persistent memory device(s) generally used during actual execution of the program code. A bulk storage device may be implemented as a hard drive or other persistent data storage device. The processing system 800 may also include one or more cache memories (not shown) that provide temporary storage of at least some program code in order to reduce the number of times program code must be retrieved from the bulk storage device 810 during execution.

As shown in FIG. 8, the memory elements 804 may store an application 818. In various embodiments, the application 818 may be stored in the local memory 808, the one or more bulk storage devices 810, or apart from the local memory and the bulk storage devices. It should be appreciated that the data processing system 800 may further execute an operating system (not shown in FIG. 8) that can facilitate execution of the application 818. The application 818, being implemented in the form of executable program code, can be executed by the data processing system 800, e.g., by the processor 802. Responsive to executing the application, the data processing system 800 may be configured to perform one or more operations or method steps described herein.

Input/output (I/O) devices depicted as an input device 812 and an output device 814, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 814 may be any type of screen display, such as plasma display, liquid crystal display (LCD), organic light emitting diode (OLED) display, electroluminescent (EL) display, or any other indicator, such as a dial, barometer, or light emitting diode (LED). In some implementations, the system may include a driver (not shown) for the output device 814. Input and/or output devices 812, 814 may be coupled to the data processing system either directly or through intervening I/O controllers.

In an embodiment, the input and the output devices may be implemented as a combined input/output device (illustrated in FIG. 8 with a dashed line surrounding the input device 812 and the output device 814). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 816 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 800, and a data transmitter for transmitting data from the data processing system 800 to said systems, devices and/or networks. Modems, cable modems, and Ethernet cards are examples of different types of network adapter that may be used with the data processing system 800.

SELECT EXAMPLES

The following paragraphs provide various examples of the embodiments disclosed herein.

Example 1 provides a transconductor circuit that includes an input port, configured to receive an input signal (a voltage signal); an output port, configured to provide an output signal (a current signal); a transistor arrangement, including a plurality of transistors; and a switch arrangement, including a plurality of switches, configured to change coupling between the input port, the output port, and the plurality of transistors to place the transconductor circuit in a first mode of operation or a second mode of operation, where an input capacitance of the transconductor circuit operating in the first mode is larger than an input capacitance of the transconductor circuit operating in the second mode.

Example 2 provides the transconductor circuit according to example 1, where the input capacitance of the transconductor circuit operating in the first mode is about 4 times larger than the input capacitance of the transconductor circuit operating in the second mode.

Example 3 provides the transconductor circuit according to examples 1 or 2, where the plurality of transistors includes transistors M1, M2, M3, and M4, each of which having a gate terminal, a drain terminal, and a source terminal.

Example 4 provides the transconductor circuit according to example 3, where, in the first mode of operation: the switch arrangement is configured to couple the input port to the gate terminal of each of the transistor M1, the transistor M2, the transistor M3, and the transistor M4; the transistor M1 is in electrical parallel with the transistor M3; and the transistor M2 is in electrical parallel with the transistor M4.

Example 5 provides the transconductor circuit according to examples 3 or 4, where, in the second mode of operation, the switch arrangement is configured to couple the input port to the gate terminal of the transistor M1, and couple the gate terminal of each of the transistor M2, the transistor M3, and the transistor M4 to a ground potential. The gate terminal of the transistor M2 may be coupled to the positive power supply voltage. In the second mode of operation, the transistors M3 and M4 may be off, and the transistor M2 may be in a triode mode and may effectively act as a small resistor, and M1 may be in saturation, having a transconductance gm. The input capacitance is $W*L*Cox$, where W is the channel width of the transistors M1-M4, L is the channel length of the transistors M1-M4, and Cox is the oxide capacitance of the gate oxide of the transistors M1-M4.

Example 6 provides the transconductor circuit according to any one of examples 3-5, where the drain terminal of the transistor M1 is coupled to the drain terminal of the transistor M3 and to the output port, the source terminal of the transistor M1 is coupled to the drain terminal of the transistor M2, the source terminal of the transistor M3 is coupled to the drain terminal of the transistor M4, and each of the source terminal of the transistor M2 and the source terminal of the transistor M4 is coupled to a ground potential.

Example 7 provides the transconductor circuit according to any one of examples 3-6, where the plurality of switches includes a switch S1, between the input port and each of the gate terminal of the transistor M2 and the gate terminal of the transistor M4, a switch S2, between a positive supply potential and each of the gate terminal of the transistor M2 and the gate terminal of the transistor M4, a switch S3, between the gate terminal of the transistor M1 and the gate terminal of the transistor M3, and a switch S4, between the ground potential and the gate terminal of the transistor M4. Each switch of the switches S1-S4 is configured to be either in a first state or in a second state, where the first state is a state that allows conduction of current through the switch (e.g., the first state may be what is conventionally referred to as the switch being closed) and the second state is a state that does not allow substantial conduction of current through the switch (e.g., the second state may be what is conventionally referred to as the switch being open; in this context, describing that the state does not allow "substantial conduction of current" refers to the fact that, even though there is not supposed to be any current conducted through the switch, there may still be some unintentional current, e.g., transistor leakage current if a switch is implemented as a transistor).

Example 8 provides the transconductor circuit according to example 7, where, in the first mode of operation, each of the switches S1 and S3 is in the first state and each of the switches S2 and S4 is in the second state.

Example 9 provides the transconductor circuit according to examples 7 or 8, where, in the second mode of operation, each of the switches S1 and S3 is in the second state and each of the switches S2 and S4 is in the first state.

Example 10 provides the transconductor circuit according to any one of examples 3-9, further including a resistive element, coupled between the input port and the gate terminal of the transistor M1, and a capacitor (e.g., a variable capacitor) coupled between the gate terminal of the transistor M1 and a ground potential.

Example 11 provides the transconductor circuit according to any one of examples 1-9, where the transconductor circuit is a frequency mixer of an RF transmitter, the frequency mixer includes a transconductance amplifier circuit, and the transconductance amplifier circuit includes the input port, the output port, the transistor arrangement, and the switch arrangement.

Example 12 provides the transconductor circuit according to example 11, where the transconductance amplifier circuit is one of two instances of the transconductance amplifier circuit included in the frequency mixer, the frequency mixer is configured to receive an LO signal, the output port of each of the two instances of the transconductance amplifier circuit is coupled to the LO signal, and the input port of each of the two instances of the transconductance amplifier circuit is coupled to a signal to be mixed with the LO signal.

Example 13 provides the transconductor circuit according to example 12, where the two instances of the transconductance amplifier circuit is a first pair of a plurality of pairs of the transconductance amplifier circuits included in the frequency mixer, the LO signal is an LO signal with a first phase shift, the plurality of pairs further includes a second pair of the transconductance amplifier circuits, the frequency mixer is further configured to receive an LO signal with a second phase shift, the output port of each of the two instances of the transconductance amplifier circuit of the second pair is coupled to the LO signal with the second phase shift, and the input port of each of the two instances of the transconductance amplifier circuit of the second pair is coupled to the signal to be mixed with the LO signal.

Example 14 provides the transconductor circuit according to example 13, where the first phase shift is zero degrees and the second phase shift is either 45 degrees or −45 degrees.

Example 15 provides the transconductor circuit according to any one of the preceding examples, where a transconductance of the transconductor circuit operating in the first mode is substantially equal to a transconductance of the transconductor circuit operating in the second mode.

Example 16 provides an RF system that includes a first transconductance amplifier circuit and a second transconductance amplifier circuit, where each transconductance amplifier circuit of the first and second transconductance amplifier circuits includes a respective (i.e., a different instance of) transistor arrangement and a respective switch arrangement, configured to change coupling between transistors of the respective transistor arrangement to operate the transconductance amplifier circuit in a first mode or a second mode. In such a system, for each transconductance amplifier circuit, an input capacitance of the transconductance amplifier circuit operated in the first mode of operation is larger than an input capacitance of the transconductance amplifier circuit operated in the second mode of operation. Furthermore, an input of each of the first and second transconductance amplifier circuits is coupled to a signal to be mixed with a LO signal, and an output of each of the first and second transconductance amplifier circuits is coupled to a circuit configured to multiply the output of each of the first and second transconductance amplifier circuits with the LO signal.

Example 17 provides the RF system according to example 16, where the first and the second transconductance amplifier circuits are configured to be operated in the first mode when the signal to be mixed with the LO signal is a narrow-bandwidth signal, and the first and the second transconductance amplifier circuits are configured to be operated in the second mode when the signal to be mixed with the LO signal is a wide-bandwidth signal.

Example 18 provides the RF system according to examples 16 or 17, where the signal to be mixed with the LO signal is a baseband signal.

Example 19 provides the RF system according to any one of examples 16-18, where one or both of the first and second transconductance amplifier circuits is the transconductor circuit according to any one of examples 1-15.

Example 20 provides a method of operating an RF frequency mixer, the method including operating a transconductance amplifier circuit of the RF frequency mixer in a first mode when a signal to be upconverted is a narrow-bandwidth signal; and operating the transconductance amplifier circuit of the RF frequency mixer in a second mode when the signal to be upconverted is a wide-bandwidth signal, where an input capacitance of the transconductance amplifier circuit operated in the first mode is larger than an input capacitance of the transconductance amplifier circuit operated in the second mode.

Example 21 provides the method according to example 20, where the transconductance amplifier circuit includes transistors M1, M2, M3, and M4, each of which having a gate terminal, a drain terminal, and a source terminal, operating the transconductance amplifier circuit in the first mode includes coupling an input port of the transconductance amplifier circuit to the gate terminal of each of the transistor M1, the transistor M2, the transistor M3, and the transistor M4, and operating the transconductance amplifier circuit in the second mode includes coupling the input port to the gate terminal of the transistor M1, and coupling the gate terminal of each of the transistor M2, the transistor M3, and the transistor M4 to a ground potential. In such a configuration, the gate terminal of the transistor M2 may be coupled to the positive supply voltage.

Example 22 provides the method according to examples 20 or 21, where the transconductance amplifier circuit is the transconductor circuit according to any one of examples 1-15 and/or the transconductance amplifier circuit is one or both of the first and second transconductance amplifier circuits of the RF system according to any one of examples 16-18.

Example 23 provides a non-transitory computer-readable storage medium including instructions for execution which, when executed by a processor, are operable to perform operations of the method according to any one of examples 20-22.

VARIATIONS AND IMPLEMENTATIONS

While embodiments of the present disclosure were described above with references to exemplary implementations as shown in FIGS. 1-8, a person skilled in the art will realize that the various teachings described above are applicable to a large variety of other implementations.

In the discussions of the embodiments above, components of a system, such as e.g. phase adjusters, mixers, upconverters, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to implementing transconductor circuits with programmable tradeoff between bandwidth and flicker noise.

Parts of various systems for implementing transconductor circuits with programmable tradeoff between bandwidth and flicker noise as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the RF transmitters or portions thereof, shown in FIGS. 4-7, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present FIGS. may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in the present disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to implementing transconductor circuits with programmable tradeoff between bandwidth and flicker noise as proposed herein illustrate only some of the possible functions that may be executed by, or within, system illustrated in the present figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Note that all optional features of the apparatus described above may also be implemented with respect to the method or process described herein and specifics in the examples may be used anywhere in one or more embodiments. Numerous other changes, substitutions, variations, alterations, and modifications may be ascertained to one skilled in the art and it is intended that the present disclosure encompass all such changes, substitutions, variations, alterations, and modifications as falling within the scope of the appended claims.

The invention claimed is:

1. An electronic component, comprising:
a transconductor circuit, comprising:
an input port;
an output port;
a transistor arrangement, comprising transistors M1, M2, M3, and M4; and
a switch arrangement, comprising switches S1, S2, S3, and S4 to place the transconductor circuit in a first mode of operation or a second mode of operation,
wherein:
the switch S1 is between the input port and each of a gate of the transistor M2 and a gate of the transistor M4,
the switch S2 is between a supply potential and each of the gate of the transistor M2 and the gate of the transistor M4,
the switch S3 is between a gate of the transistor M1 and a gate of the transistor M3, and
the switch S4 is between a ground potential and the gate of the transistor M3.

2. The electronic component according to claim 1, wherein an input capacitance of the transconductor circuit in the first mode is about 4 times larger than an input capacitance of the transconductor circuit in the second mode.

3. The electronic component according to claim 1, wherein, in the first mode of operation:
the switch arrangement is to couple the input port to the gate of each of the transistors M1, M2, M3, and M4,
the transistor M1 is in parallel with the transistor M3, and
the transistor M2 is in parallel with the transistor M4.

4. The electronic component according to claim 1, wherein, in the second mode of operation, the switch arrangement is to:
couple the input port to the gate of the transistor M1, and
couple the gate of each of the transistor M2, the transistor M3, and the transistor M4 to the ground potential.

5. The electronic component according to claim 1, wherein:
a drain of the transistor M1 is coupled to a drain of the transistor M3 and to the output port,
a source of the transistor M1 is coupled to a drain of the transistor M2,
a source of the transistor M3 is coupled to a drain of the transistor M4, and
each of a source of the transistor M2 and a source of the transistor M4 is coupled to the ground potential.

6. The electronic component according to claim 1, wherein
each switch of the switches S1, S2, S3, and S4 is to be either in a first state or in a second state, where the first state is a state that allows conduction of current through the switch and the second state is a state that does not allow substantial conduction of current through the switch.

7. The electronic component according to claim 6, wherein, in the first mode of operation, each of the switches S1 and S3 is in the first state and each of the switches S2 and S4 is in the second state.

8. The electronic component according to claim 6, wherein, in the second mode of operation, each of the switches S1 and S3 is in the second state and each of the switches S2 and S4 is in the first state.

9. The electronic component according to claim 1, further comprising:
a resistive element between the input port and the gate of the transistor M1, and
a capacitor between the gate of the transistor M1 and the ground potential.

10. The electronic component according to claim 1, wherein:
the electronic component is a frequency mixer of a radio frequency (RF) transmitter.

11. The electronic component according to claim 10, wherein:
the transconductor circuit is a first transconductor circuit,
the frequency mixer further includes a second transconductor circuit and a further transistor arrangement,
the frequency mixer is configured to receive a local oscillator (LO) signal,
the input port of the first transconductor circuit is coupled to a first signal to be mixed with the LO signal,
an input port of the second transconductor circuit is coupled to a second signal to be mixed with the LO signal, and
each of the output port of the first transconductor circuit and an output port of the second transconductor circuit is coupled to the further transistor arrangement.

12. The electronic component according to claim 11, wherein:
the frequency mixer includes a plurality of pairs of transconductor circuits,
the first transconductor circuit and the second transconductor circuit are a first pair of the plurality of pairs,
the plurality of pairs further includes a second pair of transconductor circuits,
the LO signal is an LO signal with a first phase shift,
the frequency mixer is further configured to receive an LO signal with a second phase shift,
an input port of a first transconductor circuit of the second pair of transconductor circuits is coupled to a further first signal to be mixed with the LO signal with the second phase shift, and
an input port of a second transconductor circuit of the second pair of transconductor circuits is coupled to a further second signal to be mixed with the LO signal with the second phase shift.

13. The electronic component according to claim 12, wherein the first phase shift is zero degrees, and the second phase shift is either 45 degrees or −45 degrees.

14. The electronic component according to claim 1, wherein a transconductance of the transconductor circuit in the first mode is substantially equal to a transconductance of the transconductor circuit in the second mode.

15. A method of operating a radio frequency (RF) frequency mixer, the method comprising:
operating a transconductance amplifier circuit of the RF frequency mixer in a first mode when a signal to be upconverted is a narrow-bandwidth signal; and
operating the transconductance amplifier circuit of the RF frequency mixer in a second mode when the signal to be upconverted is a wide-bandwidth signal,
wherein the transconductance amplifier circuit includes an input port, an output port, transistors M1, M2, M3, and M4, and a switch arrangement to place the transconductance amplifier circuit in the first mode or the second mode, wherein, to operate the transconductance amplifier circuit in the second mode, the switch arrangement is to couple the input port to a gate of the transistor M1, and to couple a gate of each of the transistor M2, the transistor M3, and the transistor M4 to a ground potential.

16. The method according to claim 15, wherein, to operate the transconductance amplifier circuit in the first mode, the switch arrangement is to couple the input port to the gate of each of the transistor M1, the transistor M2, the transistor M3, and the transistor M4.

17. The electronic component according to claim 1, wherein an input capacitance of the transconductor circuit in the first mode is larger than an input capacitance of the transconductor circuit in the second mode.

18. An electronic component, comprising:
a transconductor circuit, comprising:
an input port;
an output port;
a transistor arrangement, comprising transistors M1, M2, M3, and M4; and
a switch arrangement comprising switches S1, S2, S3, and S4 to place the transconductor circuit in a first mode of operation or a second mode of operation,
wherein:
an input capacitance of the transconductor circuit in the first mode is larger than an input capacitance of the transconductor circuit in the second mode,
each switch of the switches S1, S2, S3, and S4 is to be either in a first state or in a second state, where the first state is a state that allows conduction of current through the switch and the second state is a state that does not allow substantial conduction of current through the switch,
to place the transconductor circuit in the first mode of operation, each of the switches S1 and S3 is in the first state and each of the switches S2 and S4 is in the second state, and
to place the transconductor circuit in the second mode of operation, each of the switches S1 and S3 is in the second state and each of the switches S2 and S4 is in the first state.

19. The electronic component according to claim 18, wherein:
a drain of the transistor M1 is coupled to a drain of the transistor M3 and to the output port,
a source of the transistor M1 is coupled to a drain of the transistor M2,
a source of the transistor M3 is coupled to a drain of the transistor M4, and
each of a source of the transistor M2 and a source of the transistor M4 is coupled to the ground potential.

20. The electronic component according to claim 18, wherein, to place the transconductor circuit in the second mode of operation, the switch arrangement is to couple the input port to a gate of the transistor M1, and to couple a gate of each of the transistor M2, the transistor M3, and the transistor M4 to a ground potential.

\* \* \* \* \*

UNITED STATES PATENT AND TRADEMARK OFFICE
CERTIFICATE OF CORRECTION

PATENT NO. : 11,569,797 B2
APPLICATION NO. : 16/910994
DATED : January 31, 2023
INVENTOR(S) : Antonio Montalvo It is certified that error appears in the above-identified patent and that said Letters Patent is hereby corrected as shown below:

On the Title Page

Item (73), in "Assignee", in Column 1, Line 1, delete "DEVICES INC," and insert --DEVICES, INC.,-- therefor Signed and Sealed this
Tenth Day of September, 2024

Katherine Kelly Vidal
*Director of the United States Patent and Trademark Office*